United States Patent
Bentolila et al.

(10) Patent No.: US 6,285,173 B1
(45) Date of Patent: Sep. 4, 2001

(54) METHOD TO SWITCH MOSFETS USING RECYCLED, PARASITIC ENERGY

(75) Inventors: Ariel S. Bentolila, Santa Clara, CA (US); Sisan Shen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/588,089

(22) Filed: Jun. 6, 2000

(51) Int. Cl.$^7$ .................................................. G05F 1/40

(52) U.S. Cl. .......................................... 323/282; 363/133

(58) Field of Search ..................................... 323/282, 283, 323/284, 285; 363/98, 132, 133, 134

(56) References Cited

U.S. PATENT DOCUMENTS

| | | | |
|---|---|---|---|
| 5,319,260 | * | 6/1994 | Wanlass ................................. 307/443 |
| 5,457,624 | * | 10/1995 | Hastings ................................ 363/127 |
| 5,973,368 | * | 10/1999 | Pearce et al. ......................... 257/368 |

* cited by examiner

*Primary Examiner*—Jessica Han
(74) *Attorney, Agent, or Firm*—Dwight N. Holmbo; Wade James Brady, III; Frederick J. Telecky, Jr.

(57) ABSTRACT

An energy efficient gate drive technique for binary push-pull MOSFET switching systems having a common switch node with inductive and capacitive elements connected to this common switch node. These energy storage elements on the common switch node can be parasitic in nature or discrete components. This technique recycles otherwise lost PMOS gate drive energy through the switch node, as a storage element, to the NMOS output FET.

15 Claims, 3 Drawing Sheets

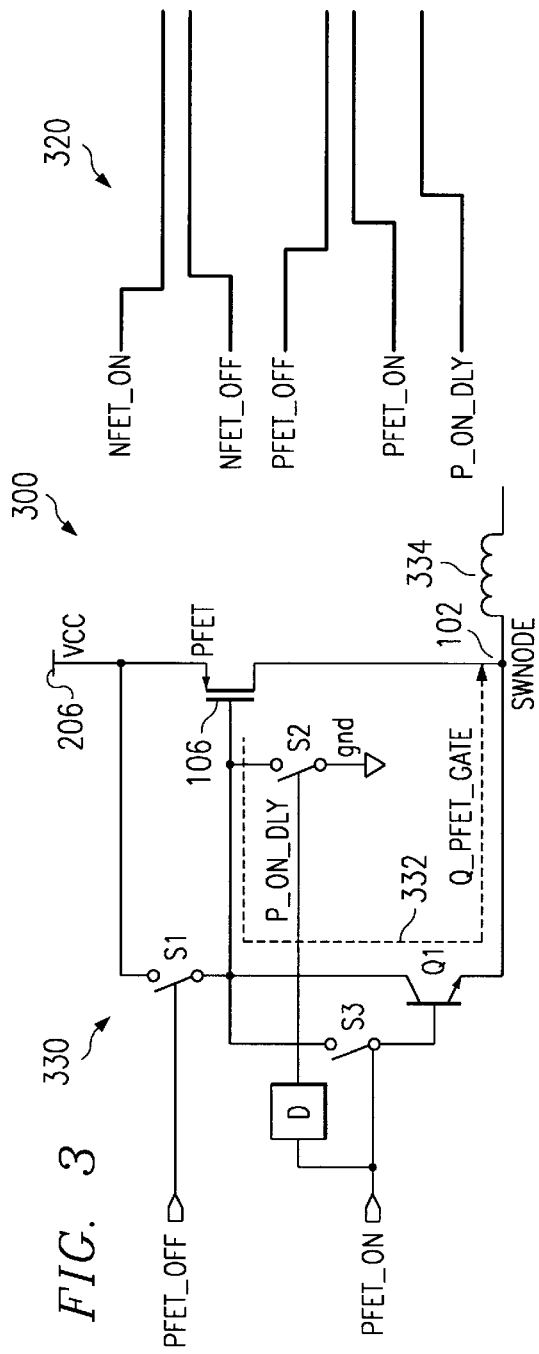
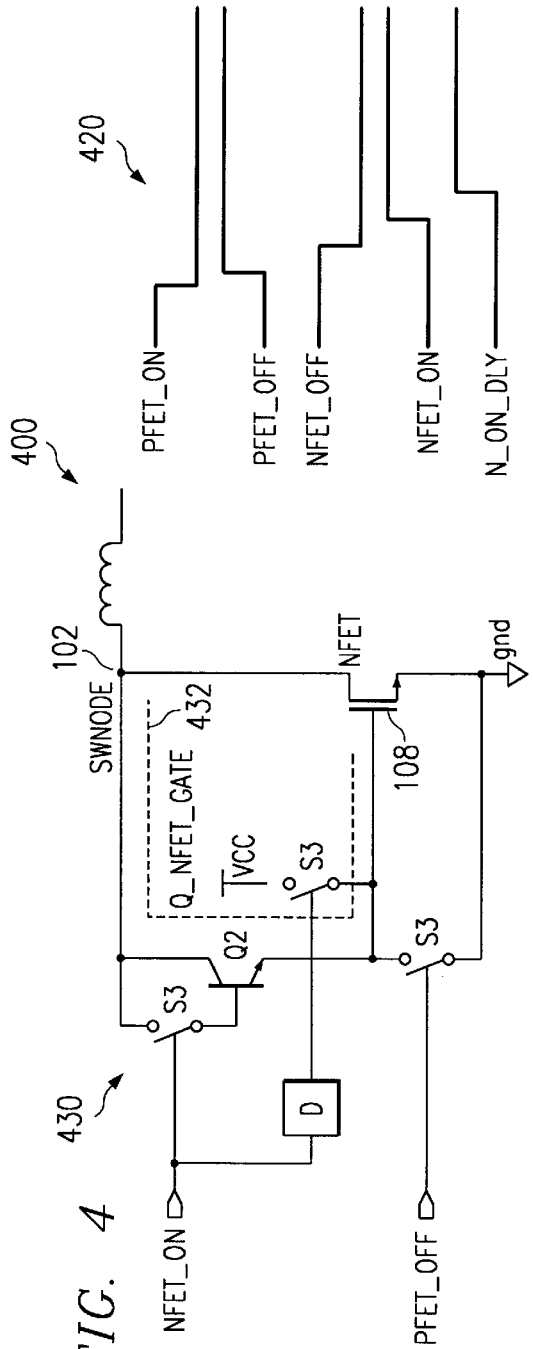

METHOD TO SWITCH MOSFETS USING RECYCLED, PARASITIC ENERGY

RELATED PATENT APPLICATIONS

This application is related to U.S. Patent Application entitled High Efficiency Switching DC—DC Regulator appln Ser. No. 09/588,399 filed on Jun. 2, 2000, by Ariel S. Bentolila and Sisan Shen.

BACKGROUND OF THE INVENTION

1. Field of the Invention

This invention relates generally to MOSFET switching methods, and more particularly to an energy efficient gate drive method for MOSFET switching systems comprising of at least one NMOS FET and at least one PMOS FET connected in a totempole, binary push-pull, configuration having a common switch node with inductive and capacitive elements connected to this common switch node. These energy storage elements on the common switch node can be parasitic in nature or discrete components.

2. Description of the Prior Art

The standard MOSFET switch mode power converter configuration has the output FET's gate drive energy source connected to the power supply. The result of this standard configuration is to take energy from the power supply to turn on the NMOS and to turn off the PMOS, and to ground energy stored in the gate capacitance of these MOSFETs when switching their conduction states. Known structures inefficiently switch totem-pole configured MOSFETs by failing to recognize that a substantial amount energy necessary to turn a FET on could be provided by otherwise wasted energy stored in inductive and capacitive elements on the common switch node of the totem-pole connected FETs. In view of the foregoing, a need exists for a technique to configure the gate drive of binary output MOSFETs to provide an energy efficient gate drive method for MOSFET switching systems comprising of at least one NMOS FET and at least one PMOS FET connected in a totem-pole, binary push-pull, configuration having a common switch node with inductive and capacitive elements connected to this common switch node; and wherein these energy storage elements on the common switch node can be parasitic in nature or discrete components.

SUMMARY OF THE INVENTION

The present invention is directed to totem-pole configured binary output MOSFETs capable of switching a binary voltage at their common switch node. The gate drive signals are like those for a typical binary output stage; however, the gate drive power source for the output FET turn on is derived from the output FET's common switch node, instead of from the system power supply.

In one aspect of the present invention, a MOS-based switch mode power converter has the gate drive of the output FET devices configured such that the on-time gate drive switching device is connected to the output switch node. The off-time gate switching devices are connected as in standard switch mode power converters familiar to those skilled in the switching converter art.

The effect of this configuration is to provide a path to transfer energy to the output switch node energy storage elements when turning on the output PMOS, and to acquire energy from the output switch node energy storage elements when turning on the output NMOS.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 3 is a timing diagram that demonstrates the control signals and active components for the output high phase of the switch depicted in FIG. 2; and FIG. 4 is a timing diagram that demonstrates the control signals and active components for the output low phase of the switch depicted in FIG. 2.

While the above-identified drawing figures set forth alternative embodiments, other embodiments of the present invention are also contemplated, as noted in the discussion. In all cases, this disclosure presents illustrated embodiments of the present invention by way or representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
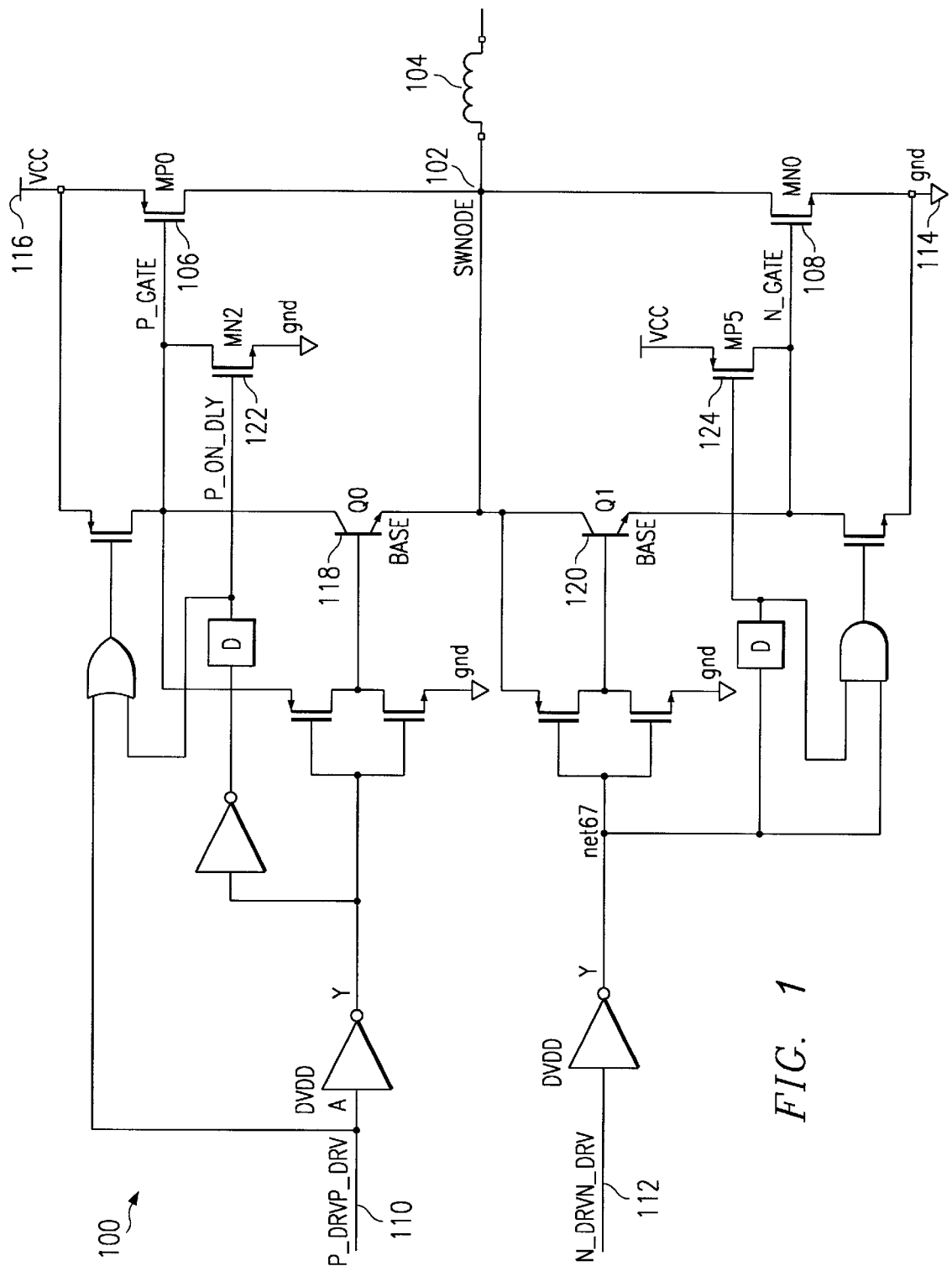
FIG. 1 illustrates a charge-recycled totem-pole, binary push-pull configured MOSFET output stage switch configuration having a common switch node with energy storage elements connected to this common switch node; and wherein these energy storage elements on the common switch node can be parasitic in nature or discrete components according to one embodiment of the present invention.

FIG. 1 illustrates a charge-recycled totem-pole, binary push-pull configured MOSFET output stage switch configuration 100 having a common switch node 102 with energy storage elements 104 connected to this common switch node 102; and wherein these energy storage elements 104 on the common switch node 102 can be parasitic in nature or discrete components according to one embodiment of the present invention. Transistors MP0 106 and MN0 108 are switched alternately on and off in response to the input control signals P_DRV 110 and N_DRV 112, respectively, in such a way that transistors MP0 106 and MN0 108 can function to provide switching regulation using gate drive energy stored and received from the common switch node 102. This technique is a significant advancement in the art when contrasted with known MOSFET switching systems that use gate drive energy stored and received from the ground 114 and power supply 116 respectively. The MOSFET output stage switch configuration 100 illustrated in FIG. 1 demonstrates one practical implementation of the present invention that provides for input control signal conditioning and a mechanism to recycle a portion of MP0 106 and MN0 108 gate drive charge. Transistors Q0 118 and Q1 120 form the controlled path to store and supply gate drive energy respectively. Transistors MN2 122 and MP5 124 serve to ensure that MP0 106 and MN0 108 turn on. Transistors MN2 122 and MP5 124 are physically sized such that they are large enough to provide the requisite threshold turn-on gate charge, energy that the common switch node 102 through transistor Q0 118 and transistor Q1 120 can not otherwise provide. The gate drive transistor, Q0 118 that turns on the main PMOS device MP0 106, and the gate drive transistor, Q1 120, that turns on the main NMOS device MN0 108, however, each have their emitter and collector, respectively, referenced to the common switch node 102 instead of ground 114 or supply voltage Vdd 116 respectively, as in more well known designs.

Figure 2:
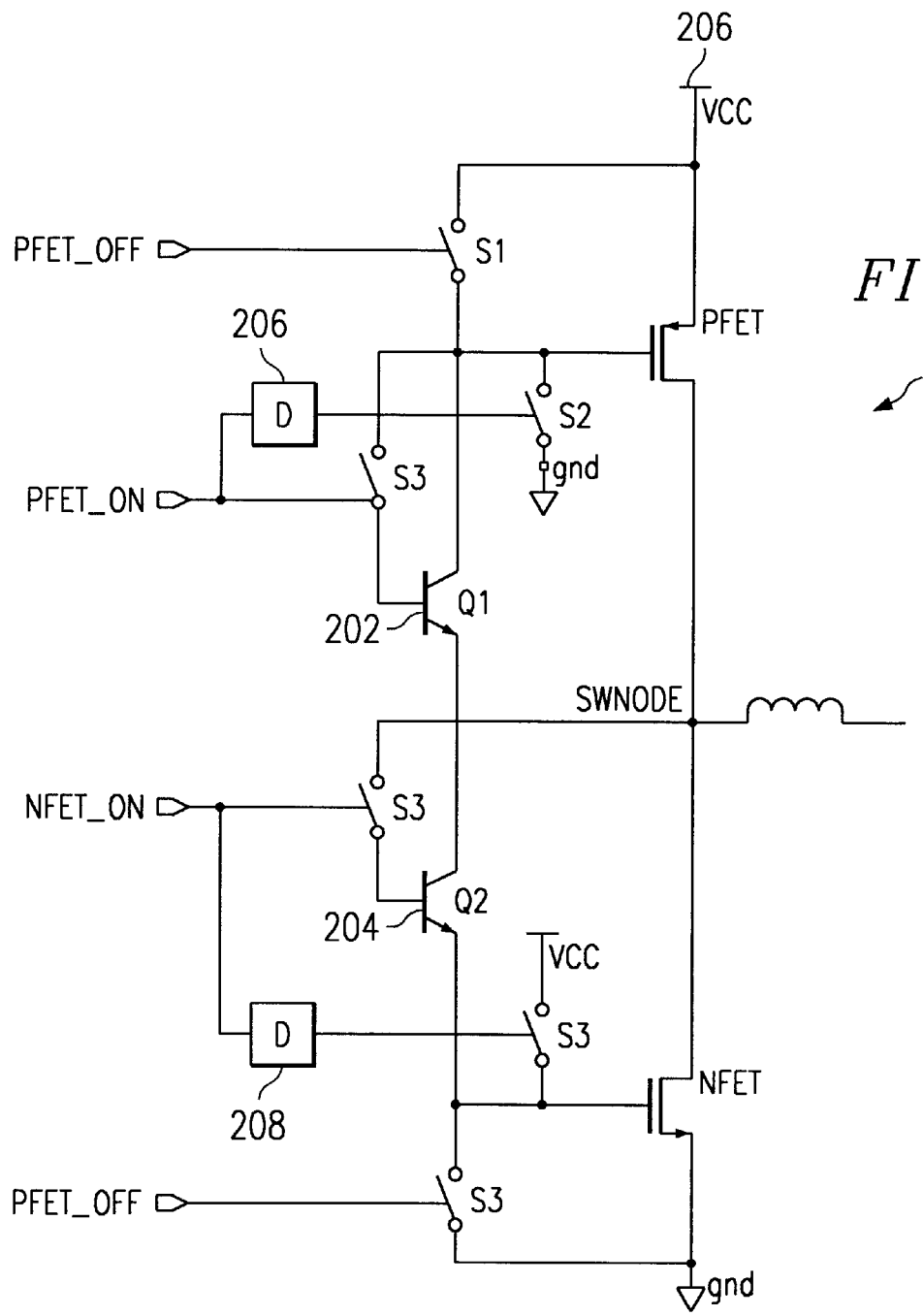
FIG. 2 is a simplified view of the MOSFET output stage switch configuration shown in FIG. 1.

FIG. 2 is a simplified MOSFET output stage switch 200 that more clearly demonstrates concepts associated with the MOSFET output stage switch configuration 100 shown in FIG. 1. Transistors Q1 202 and Q2 204 are effectively directed switches that pass current only in the direction of the arrow as illustrated by using a NPN transistor conceptual device. The blocks labeled "D" 206, 208 are delay lines that allow transistors Q1 202 and Q2 204 to transfer recycled energy before adding any energy from the power supply 206, if needed.

FIG. 3 is a timing diagram 300 that demonstrates the control signals 320 and active components 330 for the output high phase of the switch 200 depicted in FIG. 2; and FIG. 4 is a timing diagram 400 that demonstrates the control signals 420 and active components 430 for the output low phase of the switch 200 depicted in FIG. 2. FIG. 3 depicts the flow of gate charge 332 out of the output PFET 106 and into the energy storage elements 334 of the switch node 102, when the output PFET 106 is being turned on, and the output NFET 108 off. To the right of the schematic depicting the active components 330 are the related controls signals 320 and associated timing relationships. After this phase is complete, the output switch node 102 voltage is near the power supply 206 voltage. Once the PFET 106 is on, and the NMOS 108 off, the switching node 102 is guaranteed to have switched to a supply potential opposite that established just before its state change, in this case equal to the supply 206 potential. The energy recycling process is completed, as shown in FIG. 4, by transferring charge 432 stored into the switch node 102 during the prior phase to the gate of the output NFET 108. To the right of the schematic depicting the active components 430 are the related controls signals 420 and associated timing relationships. Once the NMOS 108 is on, and the PFET 106 off, the switching node 102 is guaranteed to have switched to a supply potential opposite that established just before its state change, in this case near the ground potential.

In summary explanation of the foregoing, the output FETs 106, 108 are turned off as in prior art, and turned on as prescribed by this invention. According to one aspect of the invention, the switch node 102 is always guaranteed to be in an opposite charge state than that of the FET to be turned on. This ensures that the switch node 102 will always be able to provide, to some degree, FET turn on energy that would have otherwise been recombined with the power supply.

In a particular embodiment of this invention, an inductor device 104 is connected to the switch node 102, as would be done in a DC—DC switching regulator. Typically, the switch node 102 will have significant capacitive parasitics from the output FETs 106, 108 and possibly a Schottky clamping diode (not shown). Within limits, the larger the effective inductance and capacitance of the switch node 102, the more energy that can be recycled as prescribed by this invention.

Importantly, most of the requisite energy is provided by the inductor 104 as well as the output parasitic capacitance through each respective output FET 106, 108. Known structures and techniques actually waste this energy to the ground. In contradistinction, using the present inventive techniques described herein above, the gate drive is seen to receive more 'free' energy from the output switching node 102 as the respective switch node parasitics increases in size, within certain limits, as more energy can be stored for transfer. Given the current technology, the PFET 106 is always much larger then the NFET 108; hence, there is enough gate energy to turn on the NFET 108 if it can be adequately transferred from the PFET 106.

In summary, the present high efficiency MOSFET switching technique recirculates gate drive charge, thereby providing a substantial portion of the gate drive energy necessary to drive the output FET devices, and providing a significant efficiency boost. Known structures waste gate drive charge by failing to recognize that most of the energy necessary to turn a FET on could be provided by the otherwise wasted energy of the complement FET being turned off.

This invention has been described in considerable detail in order to provide those skilled in switching converter and switching regulator design with the information needed to apply the novel principles and construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A MOSFET switching system comprising:
   at least one NMOS FET;
   at least one PMOS FET connected to the at least one NMOS FET to formulate a totem-pole, binary push-pull, configuration having a common switch node;
   at least one energy storage element connected to the common switch mode; and
   a gate drive system connected to the common switch node and configured such that the gate drive system in association with the at least one energy storage element can supply and store gate energy for the at least one PMOS FET and the at least one NMOS FET in response to gate control signals, wherein at least some of the gate energy is provided by the energy storage element.

2. The MOSFET switching system according to claim 1 wherein the at least one NMOS FET and the at least one PMOS FET are configured for alternating an input voltage applied to the at least one energy storage element in response to the control signals generated by the gate drive system such that a regulated voltage is generated at the common switch node.

3. The MOSFET switching system according to claim 2 wherein the gate drive system is configured to acquire energy from the at least one energy storage element and therefrom generate the gate control signals.

4. The MOSFET switching system according to claim 1 further comprising a plurality of delay lines configured to prevent transfer of power supply energy to the FET gates until available excess energy from the at least one energy storage element is depleted.

5. The MOSFET switching system according to claim 1 wherein the at least one energy storage element comprises at least one inductor in combination with a parasitic capacitance associated with the at least one NMOS FET and the at least one PMOS FET.

6. The MOSFET switching system according to claim 1 wherein the at least one energy storage element comprises an inductor.

7. The MOSFET switching system according to claim 6 wherein the at least one energy storage element further comprises a parasitic capacitance.

8. A MOSFET switching system comprising:

at least one NMOS FET having a gate, drain and source;

at least one PMOS FET having a gate, drain and source and connected to the at least one NMOS FET to formulate a totem-pole, binary push-pull, configuration having a common switch node;

at least one energy storage element connected to the common switch node;

a first switch connected at one end to the PMOS FET gate and connected at an opposite end to a switching system ground;

a second switch connected at one end to the NMOS FET gate and connected at an opposite end to a switching system supply voltage;

a third switch connected at one end to the PMOS FET gate and coupled at an opposite end to the common switch node;

a fourth switch coupled at one end to the NMOS FET gate and connected at an opposite end to the common switch node;

a first delay element connected at one end to the first switch and connected at an opposite end to the third switch; and a second delay element connected at one end to the second switch and connected at an opposite end to the fourth switch.

9. The MOSFET switching system according to claim 8 further comprising a fifth switch connected at one end to the PMOS FET gate and connected at an opposite end to the switching system supply voltage.

10. The MOSFET switching system according to claim 9 further comprising a sixth switch connected at one end to the NMOS FET gate and connected at an opposite end to the switching system ground.

11. The MOSFET switching system according to claim 10 further comprising a first NPN bipolar transistor having a collector connected to the PMOS FET gate, an emitter connected to the common switch node, and a base connected to the third switch.

12. The MOSFET switching system according to claim 11 further comprising a second NPN bipolar transistor having a collector connected to the common switch node, an emitter connected to the NMOS FET gate, and a base connected to the fourth switch.

13. The MOSFET switching system according to claim 12 wherein the first and second delay elements are configured to allow the first and second NPN bipolar transistors to transfer recycled energy before energy is transferred from the switching system supply voltage.

14. The MOSFET switching system according to claim 13 wherein the recycled energy is energy stored in the at least one energy storage element.

15. The MOSFET switching system according to claim 14 wherein the recycled energy is energy stored by parasitic capacitance associated with the PMOS FET and the NMOS FET.

* * * * *